US006811581B2

(12) United States Patent
Yamada et al.

(10) Patent No.: US 6,811,581 B2
(45) Date of Patent: Nov. 2, 2004

(54) HIGH-SPEED TOOL STEEL GEAR CUTTING TOOL AND MANUFACTURING METHOD THEREFOR

(75) Inventors: Yasuyuki Yamada, Akashi (JP); Natsuki Ichimiya, Akashi (JP); Koichi Maeda, Akashi (JP); Yusuke Tanaka, Akashi (JP); Kazuaki Tanaka, Akashi (JP)

(73) Assignee: Mitsubishi Materials Kobe Tools Corporation, Akasahi (JP)

( * ) Notice: Subject to any disclaimer, the term of this patent is extended or adjusted under 35 U.S.C. 154(b) by 0 days.

(21) Appl. No.: 09/984,716

(22) Filed: Oct. 31, 2001

(65) Prior Publication Data

US 2002/0081161 A1 Jun. 27, 2002

(30) Foreign Application Priority Data

Oct. 31, 2000 (JP) ........................... 2000-332675
Apr. 24, 2001 (JP) ........................... 2001-126009

(51) Int. Cl.$^7$ ..................... G23F 21/25; G23F 21/26
(52) U.S. Cl. ..................... 51/307; 51/309; 428/216; 428/336; 428/469; 428/472; 428/697; 428/698; 428/699
(58) Field of Search ................. 428/216, 336, 428/697, 698, 699, 472, 469; 51/295, 307, 309

(56) References Cited

U.S. PATENT DOCUMENTS

| | | | | |
|---|---|---|---|---|
| 3,891,477 | A | * | 6/1975 | Lance at al. |
| 5,002,729 | A | * | 3/1991 | Wert et al. |
| 5,183,518 | A | * | 2/1993 | Radon |
| 5,221,372 | A | * | 6/1993 | Olson |
| 5,259,200 | A | * | 11/1993 | Kamody |
| 5,366,564 | A | * | 11/1994 | Yamagata et al. |
| 5,424,028 | A | * | 6/1995 | Maloney et al. |
| 5,656,383 | A | * | 8/1997 | Tanaka et al. |
| 5,851,313 | A | * | 12/1998 | Milam |
| 5,875,636 | A | * | 3/1999 | Kamody |
| 6,077,596 | A | * | 6/2000 | Hashimoto et al. |
| 6,103,357 | A | * | 8/2000 | Selinder et al. |
| 6,105,374 | A | | 8/2000 | Kamody |
| 6,110,571 | A | * | 8/2000 | Yaginuma et al. |
| 6,176,946 | B1 | * | 1/2001 | Kuchmann et al. |
| 6,220,797 | B1 | * | 4/2001 | Ishii et al. |
| 6,241,431 | B1 | * | 6/2001 | Derflinger et al. |
| 6,314,743 | B1 | * | 11/2001 | Hutchison |
| 6,416,262 | B1 | * | 7/2002 | Ishimaru et al. |
| 6,492,011 | B1 | * | 12/2002 | Brandle et al. |

FOREIGN PATENT DOCUMENTS

| | | |
|---|---|---|
| DE | 25 17 147 | 10/1976 |
| EP | 0 301 168 | 2/1989 |
| EP | 1 167 551 | 1/2002 |
| JP | 7-310173 | 11/1995 |

OTHER PUBLICATIONS

R. F. Barron, Conference Manufacturing Strategies, vol. 6, XP–001021857, pp. 535–548, "Cryogenic Treatment of Tool Steels", Mar. 17, 1996.

* cited by examiner

Primary Examiner—Archene Turner
(74) Attorney, Agent, or Firm—Oblon, Spivak, McClelland, Maier & Neustadt, P.C.

(57) ABSTRACT

The invention provides a high-speed tool steel gear cutting tool in which fracture or chipping does not occur at the cutting edge, and which realizes excellent cutting performance over long periods. Moreover, a method of manufacturing a gear cutting tool including: a step for quenching a tool material comprising high-speed tool steel and which has been rough processed to a shape corresponding to a final shape of a gear cutting tool, to transform a structure of the tool material into martensite, a step for temperling the tool material after quenching to transform any residual austenite dispersingly distributed throughout a matrix of the martensite structure formed by the quenching, into martensite, and a step for finishing the tool material after tempering to a final shape, is characterized in that the tool material after quenching is subjected to sub-zero treatment involving cooling and holding at a temperature of less than –150° C.

2 Claims, 2 Drawing Sheets

HIGH-SPEED TOOL STEEL GEAR CUTTING TOOL AND MANUFACTURING METHOD THEREFOR

BACKGROUND OF THE INVENTION

1. Field of the Invention

The present invention relates to a high-speed tool steel gear cutting tool (hereunder referred to simply as a gear cutting tool) in which fractures or chipping (minute fractures) do not occur at the cutting edge even when performing gear cutting at high-speed, and which realizes excellent cutting performance over long periods, and a manufacturing method therefor.

2. Description of the Related Art

Heretofore, in the gear cutting of tooth profiles for various gears used as constituent members for automobiles, aircraft, and various drive units, a gear cutting tool such as for example the hob (solid hob) shown in FIG. 1, a pinion cutter, or a shaving cutter are used.

Furthermore, manufacture of this gear cutting tool by the following steps as illustrated hereunder in (a) to (e) it also well known.

(a) Hot forge an ingot of high-speed tool steel at a temperature of 1100 to 1150° C. to make a bar with an outer diameter of 50 to 150 mm.

(b) Fully anneal the bar stock and then cut to a predetermined length, mill, and rough treatment into a tool material of a shape corresponding to the shape of the final gear cutting tool.

(c) Heat and hold the tool material at a temperature of 1210 to 1270° C. in an atmosphere of nitrogen, and then quench the tool material by blow cooling with pressurized nitrogen gas, to transform the structure of the tool material into martensite.

(d) Heat and hold the post quenched tool material at a temperature of 500 to 550° C. in an atmosphere of nitrogen to temper the tool material and transform the residual austenite dispersingly distributed in the matrix of the martensite structure formed in the quenching into martensite.

(e) Finish the post quenched and tempered tool material into a final shape by for example grinding or polishing.

Furthermore, as the abovementioned gear cutting tool, there is also known a coated gear cutting tool as disclosed for example in Japanese Patent Application, First Publication No. Hei7-310173, where the surface of the high-speed tool steel base metal is physical vapor deposited to an average thickness of 2 to 15 μm with a hard coating layer comprising either or both of; a composite nitride [hereunder denoted by (Ti, Al) N] layer of Ti and Al and a composite carbonitride [hereunder denoted by (Ti, Al) CN] layer of Ti and Al, for which in the case where these are expressed by composition formula: $[Ti_{1-x}Al_x]N$ and composition formula: $[Ti_{1-x}Al_x]C_{1-m}Nm$, the atomic ratio measured using an Auger spectroscopy analysis apparatus, of a central portion in the thickness direction satisfies x: 0.30 to 0.70, m: 0.6 to 0.99.

This coated gear cutting tool is shown for example in outline in FIG. 2, and is manufactured using a cathodic arc ion plating apparatus being one type of physical vapor deposition apparatus. In this case, for example the interior of the apparatus is made a vacuum atmosphere of 20 m torr, and in a condition heated with a heater to a temperature of 500° C., an arc discharge is generated under conditions of for example voltage: 35 V, current: 90 A between an anode electrode and the cathode electrode on which is set a Ti~Al alloy having a predetermined composition. At the same time, a nitrogen gas, or a nitrogen and methane gas, is introduced to inside the apparatus as the reaction gas, and a bias voltage of for example 200 V is applied to the base metal comprising the high-speed tool steel (hereunder simply base metal) so that the hard coating layer is physical vapor deposited on the surface of the base metal.

However, in recent times FA (factory automation) of gear cutting apparatus has become remarkable and there is a strong demand for labor saving and energy saving in the gear cutting process and a reduction in cost. Together with this, there is a demand for generality to enable a variety of gear cutting processes to be performed with only one type of gear cutting tool, and there is also a trend towards speeding up the gear cutting process.

As a result, in the conventional gear cutting tool, in the case where this is used in gear cutting under normal conditions there are no problems. However when used in high-speed gear cutting, this is susceptible chipping, particularly at the ridge line intersection of the rake face and the relief face of the cutting edge, so that the useful life is reached in a comparatively short time.

On the other hand, in the case of the conventional coated gear cutting tool, in the case where this is used in gear cutting under normal conditions, with carbon steel or cast iron or the like there are no problems. However when used in high-speed gear cutting of gears such as low-alloy steel or mild steel with extremely high viscosity, since the affinity between the chips produced by the cutting and the (Ti, Al) N layer or the (Ti, Al) CN layer constituting the hard coating layer is high, the chips are susceptible to adhering to the surface of the cutting edge of the gear cutting tool. This adhering phenomena becomes remarkably apparent the higher the speed of the gear cutting process, and with this adhering phenomena as the cause, fracture and chipping occurs at the cutting edge, so that the useful life is reached in a comparatively short time.

SUMMARY OF THE INVENTION

The present inventors, as a result of performing research from the abovementioned view point, into the manufacture of gear cutting tools for which the ridge line of the cutting edge demonstrates excellent anti-chipping even when used in high-speed gear cutting processes, have obtained the following research results shown in (1) to (4).

(1) In the case of the abovementioned conventional manufacturing method for a gear cutting tool, a 20 to 30 weight % (hereunder simply %) residual austenite exists in the martensite matrix in the tool material after quenching. Consequently, even if the residual austenite diffusingly distributed in the matrix of the martensite structure formed by the quenching is transformed into martensite, the existence of around 1 to 5% residual austenite cannot be avoided. This 1 to 5% residual austenite is comparatively coarse, and the shape thereof is nonuniform. Therefore this becomes a starting point for the chipping at the time of high-speed gear cutting.

(2) When the post quenched tool material is subjected to sub-zero treatment by cooling and holding at a temperature of below −150° C., the residual austenite dispersingly distributed in a proportion of 20 to 30% in the matrix which has been transformed into martensite by the quenching is reduced to below 5%, and the shape thereof becomes fine and uniform.

(3) When tempering is performed on the post sub-zero treated tool material, a condition results where residual austenite is substantially non existent in the matrix which has been transformed into martensite, or exists but the proportion thereof is less than 0.5%. Moreover, the form thereof is extremely fine grained.

(4) In the gear cutting tool having a structure where residual austenite is substantially non existent in the matrix which has been transformed into martensite, or having a structure where residual austenite exists, but the proportion thereof is less than 0.5% and the form thereof is very fine grained, the starting point for chipping does not exist in the structure. Therefore, even if high-speed gear cutting is performed, there is no occurrence of chipping in the ridge line of the cutting edge, and excellent cutting performance can be demonstrated over a long period.

The present invention is based on the abovementioned research results, and is one where a method of manufacturing a gear cutting tool including: a step for quenching a tool material comprising high-speed tool steel and which has been rough processed to a shape corresponding to a final shape of a gear cutting tool, to transform a structure of the tool material into martensite, a step for tempering the tool material after quenching to transform any residual austenite dispersingly distributed throughout a matrix of the martensite structure formed by the quenching, into martensite, and a step for finishing the tool material after tempering to a final shape, is characterized in that the tool material after quenching is subjected to sub-zero treatment involving cooling and holding at a temperature of less than $-150°$ C., and transforming any residual austenite which is dispersingly distributed throughout the matrix into martensite, to thereby transform the structure of the tool material after tempering into a structure in which residual austenite which is a starting point for chipping at the time of high-speed gear cutting does not exist in the matrix of the martensite.

Furthermore, regarding the sub-zero treatment, preferably this is performed under conditions where the tool material after quenching is cooled using liquid nitrogen, at a predetermined cooling rate within a range of 1 to $10°$ C./minute to a predetermined temperature within a range of $-150$ to $-200°$ C., and held at this temperature for a predetermined time within a range of 1 to 5 hours, and then raised in temperature at a predetermined temperature raising rate within a range of 1 to $10°$ C./min.

The cooling rate, the cooling temperature of less than $-150°$ C., the holding time at the cooling temperature, and the temperature raising rate in the above mentioned sub-zero treatment are all empirically determined. In particular, regarding the cooling temperature, if the cooling temperature is higher than $-150°$ C., it is difficult to transform the residual austenite into the desirable martensite.

On the other hand, as a result of performing research into developing a coated gear cutting tool for which the adhesion of chips to the surface of the cutting edge is difficult, even in the case where this is used in a high-speed gear cutting process particularly for gears such as a low-alloy steel or a mild steel, the present inventors have obtained the following research results shown in (5) and (6).

(5) When Ta is dissolved in the (Ti, Al) N layer and the (Ti, Al) CN layer constituting the hard coating layer of the conventional coated gear cutting tool, so that the proportion held for the gross weight of Ti and Al becomes a proportion of 0.01 to 0.35 for the atomic ratio based on measurements using an Auger spectroscopy apparatus, of a thickness direction central portion, and a hard coating layer is made with the composite nitride of Ti, Al and Ta (hereunder shown as (Ti, Al, Ta) N) and the composite carbonitride (hereunder (Ti, Al, Ta) CN) layer of Ti, Al and Ta obtained from the results, due to the action of the Ta in this hard coating layer, the affinity to the work piece, in particular a highly viscous difficult to machine material such as low-alloy steel or mild steel is considerably reduced. Hence this has high chip lubrication properties. As a result, adhesion of the chips to the cutting edge is markedly suppressed. However, the high toughness held by the (Ti, Al) N layer and (Ti, Al) CN layer is lost.

(6) On the other hand, when the (Ti, Al) N layer and the (Ti, Al) CN layer constituting the hard coating layer of the conventional coated gear cutting tool, and the (Ti, Al, Ta) N layer and the (Ti, Al, Ta) CN layer shown in (5) above are alternately coated with the thickness of each extremely thin, that is an average thickness of 0.005 to 0.2 µm, to form a hard coating layer, the problem points of the respective layers, that is the high affinity to the chips in the (Ti, Al) N layer and the (Ti, Al) CN layer (hereunder referred to as the first thin layer), and the low toughness in the (Ti, Al, Ta) N layer and the (Ti, Al, Ta) CN layer (hereunder referred to as the second thin layer) is cancelled out between the two, thereby furnishing the high toughness held by the first thin layer and the high chip lubrication properties held by the second thin layer. As a result, even when a coated gear cutting tool having this hard coating layer is used in high-speed gear cutting of a gear comprising a difficult to machine material of high viscosity such as a low-alloy steel or mild steel, chips are unlikely to adhere to the surface of the cutting edge, and excellent cutting performance is demonstrated over a long period.

The present invention is based on the abovementioned research results. The coated gear cutting tool is characterized in that a hard coating which is physical vapor deposited at an overall average thickness of 2 to 15 µm, is formed on a surface of a base metal of a high-speed tool steel, by coating a first thin layer and a second thin layer with respective average thicknesses of 0.005 to 0.2 µm, the first thin layer comprising either or both of a (Ti, Al) N layer and a (Ti, Al) CN layer for which in the case where these are represented by composition formula: $[Ti_{1-x}Al_x]N$ and composition formula: $[Ti_{1-x}Al_x]C_{1-m}N_m$, the atomic ratio based on measurements using an Auger spectroscopy apparatus, of a thickness direction central portion satisfies X: 0.30 to 0.70, m: 0.6 to 0.99, and the second thin layer comprising either or both of a (Ti, Al, Ta) N layer and a (Ti, Al, Ta) CN layer for which in the case where these are represented by composition formula: $[Ti_{1-(X+Y)}Al_X Ta_Y]N$ and composition formula: $[Ti_{1-(X+Y)}Al_X Ta_Y]C_{1-m}N_m$, the atomic ratio based on measurements using an Auger spectroscopy apparatus, of a thickness direction central portion satisfies X: 0.30 to 0.70, Y: 0.01 to 0.35 and m: 0.6 to 0.99.

In this coated gear cutting tool, the reason for making the average layer thickness of the first thin layer and the second thin layer constituting the hard coating layer respectively 0.005 to 0.2 µm, is because if in either of these thin layers the average layer thickness becomes less than 0.005 µm, the characteristics inherent in these thin layers, that is the high toughness inherent in the first thin layer and the high chip lubrication properties inherent in the second thin layer cannot be adequately imparted to the hard coating layer. On the other hand, if the average layer thickness thereof respectively exceeds 0.2 µm, the inherent problem points of the respective thin layers, that is the chip adhering nature inherent in the first thin layer and the drop in toughness in the second thin layer, become apparent in the hard coating layer. The average layer thickness of the first thin layer and the second thin layer is more preferably 0.007 to 0.10 µm for each.

Furthermore, in the coated gear cutting tool of the present invention, the Al in the (Ti, Al) N layer and the (Ti, Al) CN layer constituting the first thin layer of the hard coated layer, and in the (Ti, Al, Ta) N layer and the (Ti, Al, Ta) CN layer constituting the second thin layer, is added in order to improve the hardness with respect to TiCN, and improve the wear resistance. However, with the X value in composition formula: $[Ti_{1-x}Al_x]N$ and composition formula: $[Ti_{1-x}Al_x]C_{1-m}N_m$, and also in composition formula: $[Ti_{1-(x+y)}Al_xTa_y]N$ and composition formula: $[Ti_{1-(x+y)}Al_xTa_y]C_{1-m}N_m$, is less than 0.30 for the atomic ratio (and similarly hereunder), the desired wear resistance cannot be ensured. On the other hand, if the above value exceeds 0.70, then fracture or chipping of the cutting edge is likely to occur. Therefore, in the present embodiment, the X value is set at 0.30 to 0.70. This X value is more preferably 0.35 to 0.65.

Furthermore, since the C component in the abovementioned (Ti, Al) CN layer and the (Ti, Al, Ta) CN layer provides an affect of improving the hardness, then the (Ti, Al) CN layer and the (Ti, Al, Ta) CN layer each have a relatively high hardness compared to the abovementioned (Ti, Al) N layer and the (Ti, Al, Ta) N layer. However, if the proportion of the C component in the above mentioned composition formula is less than 0.01, that is the m value exceeds 0.99, the predetermined hardness improvement effect is not obtained. On the other hand, if the proportion of the C component exceeds 0.4, that is the m value is less than 0.6, the toughness decreases suddenly. Therefore, in the present invention, the m value is set at 0.6 to 0.99. This m value is more preferably 0.8 to 0.9.

Furthermore, due to the effect of the (Ti, Al, Ta) N layer and the (Ti, Al, Ta) CN layer constituting the second thin layer, this has excellent chip lubrication compared to the (Ti, Al) N layer and the (Ti, Al) CN layer of the first thin layer. However, if the Y value in the abovementioned composition formula is less than 0.01, the Ta content becomes insufficient, so that the predetermined chip lubrication improvement effect cannot be imparted to the hard coating layer. On the other hand, if the Y value exceeds 0.35, the toughness decreases rapidly in the overall hard coating layer. Therefore, in the present invention, the Y value is set at 0.01 to 0.35. This Y value is more preferably 0.07 to 0.30.

Furthermore, the reason for making the overall average thickness of the hard coating layer 2 to 15 µm, is that at a layer thickness of 2 µm a desirable excellent wear resistance cannot be ensured, while if the layer thickness exceeds 15 µm, fracture or chipping of the cutting edge is likely to occur. The layer thickness is more preferably 3 to 10 µm.

PREFERRED EMBODIMENTS

First Embodiment

A cutting tool of the present invention will now be specifically described by means of an embodiment.

Three types of high-speed tool steel ingots prescribed by Japan Industrial Standard JIS SKH55, SKH56 and SKH57, all having an outside diameter of 300 mm were prepared, and each of the ingots was subjected to hot forging in a condition heated to a temperature of 1130° C., to produce bar stock of 150 mm diameter. These bar stocks were then held for 30 minutes at 880° C. and fully annealed after which they were each cut to a length of 100 mm, and then milled so that all were rough processed into tool materials of a shape corresponding to a final shape shown in FIG. 1. These tool materials were then heated to 1250° C. in a nitrogen atmosphere and held for 20 minutes, and then cooled while maintaining the cooling speed at 40–120° C./minute by adjusting the blast proportion of pressurized nitrogen gas to effect quenching, thereby transforming the structure of the tool materials into martensite. Furthermore, the proportion of residual austenite dispersingly distributed throughout the martensite matrix in the post quenched tool materials was measured using an X-ray diffractometer.

Then, liquid nitrogen was gasified and blown onto the quenched tool materials, and the blast proportion adjusted so that the tool materials were cooled at a predetermined cooling rate shown in Table 1 (annex) and cooled until a predetermined cooling temperature similarly shown in Table 1, and then held for 1 hour at this cooling temperature. Next, a heating condition was adjusted using a heater so that these tool materials were subjected to a sub-zero treatment of a temperature rise at a predetermined temperature rise rate similarly shown in Table 1, after which the proportion of the residual austenite dispersingly distributed throughout the martensite matrix was measured using an X-ray diffractometer.

Then, the post sub-zero treated tool materials were held for 1.5 hours at 550° C. to temper the tool materials, after which the proportion of residual austenite dispersingly distributed throughout the martensite matrix in the tool materials was measured using the X-ray diffractometer. Finally, by grinding each of the tempered tool materials, gear cutting tools of the shape shown in FIG. 1, having an overall dimension of 80 mm diameter and 120 mm length, and having 3 right handed threads and 20 grooves in the surface, were respectively manufactured in accordance with the manufacturing methods corresponding to Table 1 "Present invention methods 1 to 9".

Figure 1:
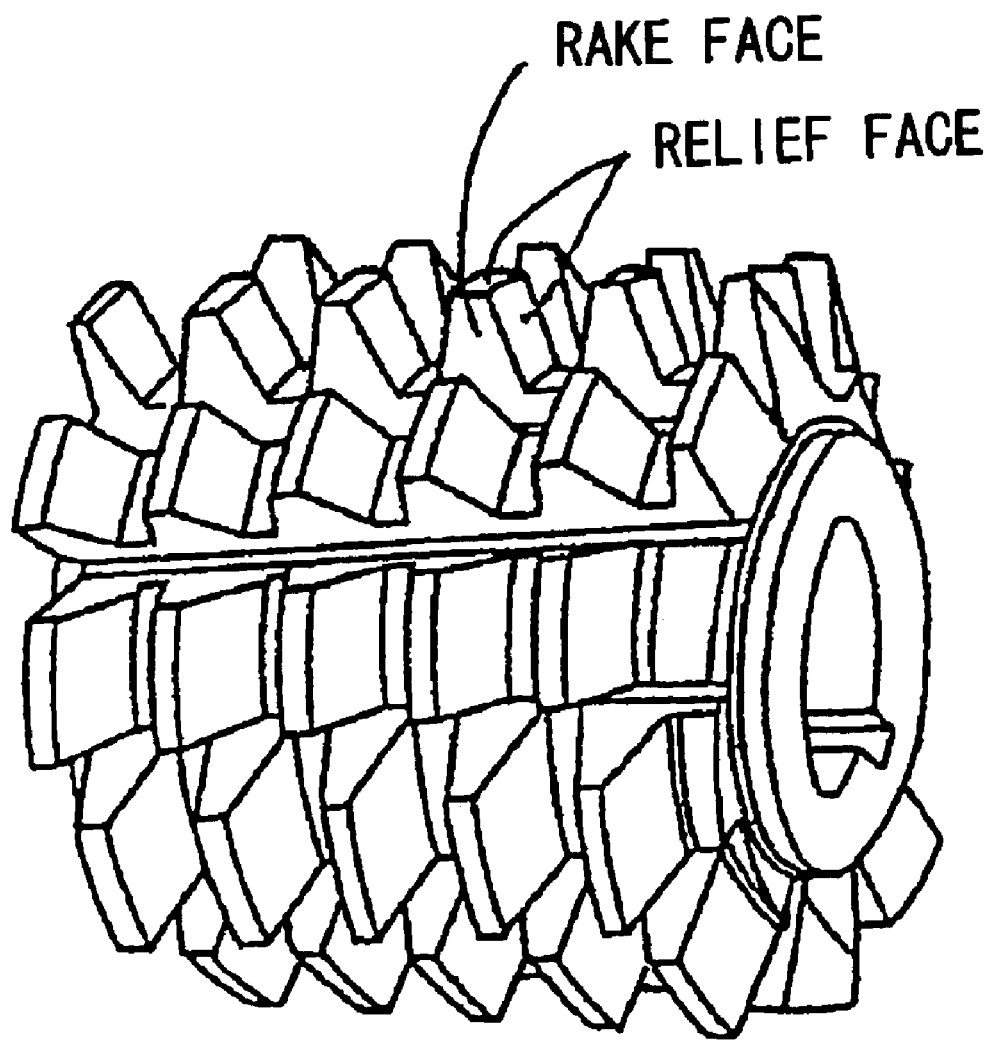
FIG. 1 is an outline perspective view of a cutting tool (solid hob) to which the present invention is applied.

Furthermore, for the purpose of comparison, cutting tools of the shape shown in FIG. 1 where respectively made by manufacturing methods corresponding to Table 1 "Conventional methods 1 to 3" (manufacturing methods the same as for the present invention except that the abovementioned sub-zero treatment was not performed).

Then using the gear cutting tools made by the present invention methods 1 to 9 and the conventional methods 1 to 3, the processing for a gear with a material corresponding to a low-alloy steel of JIS SCr 420H, and having dimensions and shape of; module: 1.75, pressure angle: 17.5 degrees, number of teeth: 33, twist angle 36 degrees left hand, gear height: 5.86 mm, gear width: 15.5 mm, was performed under high-speed cutting conditions of; cutting speed (rotational speed): 150 m/min, feed: 2 mm/rev, no climb, no shift, dry (air blown), and the number of gears processed until the wear width of the relief face reached 0.10 mm (useful life) was measured. The measurement results are shown in Table 1.

Furthermore, Table 1 also shows the measurement results for the residual austenite in the martensite matrix after the abovementioned quenching process, sub-zero treatment and tempering process.

From the results shown in Table 1 it can be seen that with the gear cutting tool made by the present invention methods 1 to 9, residual austenite does not exist in any of the martensite matrices, or if this does exist the proportion thereof is minimal at less than 0.5%. Furthermore, while not shown in Table 1, in the gear cutting tools made by the present invention methods 1 to 9, the form of the residual austenite is extremely fine grained, and the grain size is uniform. As a result, in the gear cutting tools made by the present invention methods 1 to 9, there is no chipping, particularly at the ridge line portion of the cutting edge, and these show excellent wera resistance over a long period.

On the other hand, in the gear cutting tools made by the conventional methods 1 to 3, the proportion of residual austenite in the martensite matrix is comparatively large and the grain size thereof is coarse and nonuniform. Since this becomes a starting point for chipping during high-speed gear cutting, the occurrence of chipping in the cutting edge ridge line portion is unavoidable, and as a result the useful life is reached in a comparatively short time.

As described above, according to the manufacturing method for a gear cutting tool of the present invention, a gear cutting tool can be manufactured which shows excellent resistance to chipping, and demonstrates wear resistance over a long period, not only in the case of gear cutting under normal conditions of a gear comprising for example a low-alloy steel, but also in the case of high-speed gear cutting of a gear comprising a high hardness steel or the like. Consequently, the manufacturing method for a gear cutting tool of the present invention contributes to speeding up of the gear cutting process, savings in labor and energy, and a reduction in costs.

Second Embodiment

Next is a specific description by means of an embodiment, of a coated gear cutting tool of the present invention.

Figure 2:
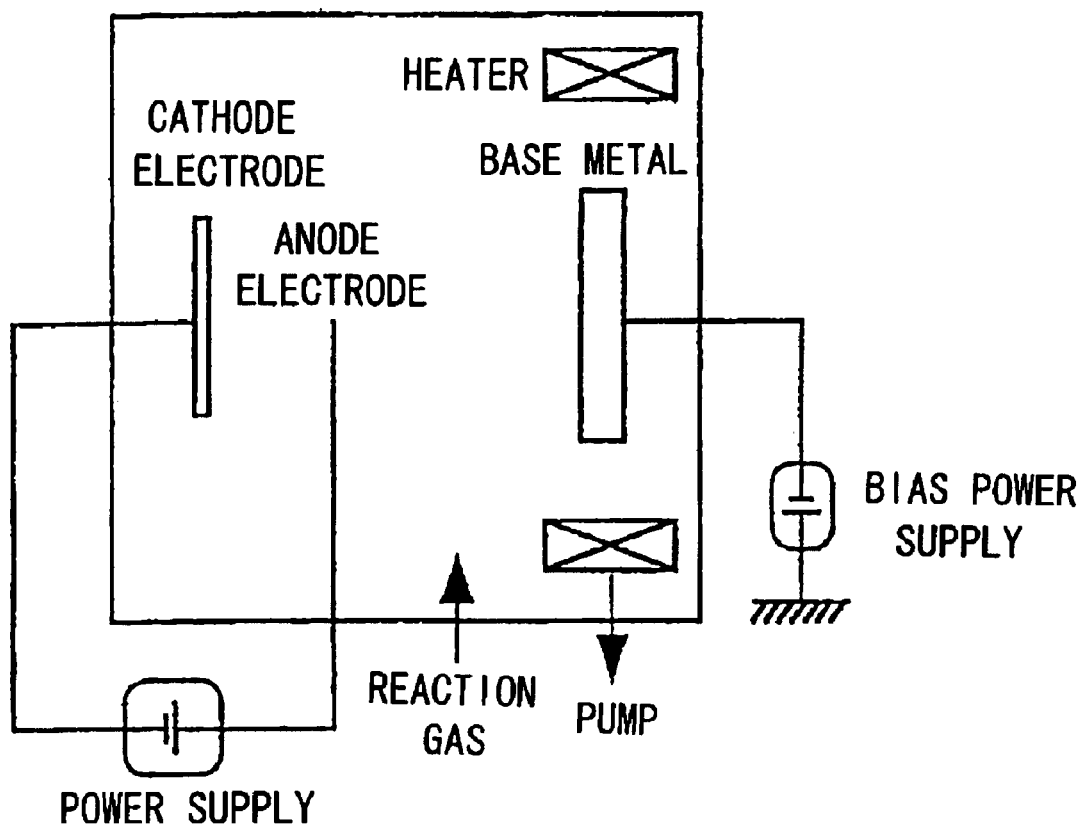
FIG. 2 is an outline explanatory diagram of a cathodic arc ion plating apparatus.

As a base metal made of a high-speed tool steel, a single thread hob for a gear made from a JIS SKH 55 material and having an outside diameter of 60 mm, and an overall dimension of 60 mm (module: 2) prescribed in JIS B 4354, and a pinion cutter made from the same material JIS SKH 55 and with 50 teeth and a pitch circle diameter of 100 mm (module: 2) prescribed by JIS B 4356 were prepared. These base metals were then ultrasonic cleaned in acetone and respectively placed in a dry condition in a conventional cathodic arc ion plating apparatus as shown for example in FIG. 2. On the other hand, for the cathode electrode (vapor source), metal alloys of respective predetermined component compositions were selected for predetermined combinations, from the first thin layer forming Ti—Al alloy and the second thin layer forming Ti—Al—Ta alloy each having component compositions shown in Table 2 (annex), and these were installed at respective corresponding positions centered on the rotation axis. Next, the interior of the apparatus was evacuated, and while being maintained at a vacuum of 0.5 pa, the interior of the apparatus was heated to 500° C. by a heater. Then Ar gas was introduced to the interior of the apparatus to give an Ar atmosphere of 10 Pa. In this condition, the rotation shaft was intermittently rotated for each predetermined time lapse corresponding to the thickness of the layer to be formed. On the other hand, a bias voltage of −800 V was applied to the base metal, and the base metal surface was bombarded and cleaned by the Ar gas. Next, a nitrogen gas, or a nitrogen and methane gas as a reaction gas was introduced to inside the apparatus to give a reaction atmosphere of 6 Pa, and also the bias voltage applied to the base metal was reduced to −200V and an arc discharge produced between the cathode electrode (the alloy on one side) and the anode electrode. Then, based on this operation, a first thin layer and a second thin layer having an objective composition and an objective thickness shown in Table 2, were alternately deposited and laminated on the surface of the base metal in a combination as shown in Table 3 (annex) and in a number of laminations as shown in the same Table 3, to thereby form a hard coating layer. As a result, coated gear cutting tools corresponding to the present invention coated gear cuttings tools 1 to 13 of Table 3 were respectively manufactured.

Furthermore, for comparison, in the above cathodic arc ion plating apparatus, a hard coating layer comprising a (Ti, Al) N layer and/or a (Ti, Al) CN layer of an objective composition and an objective layer thickness as shown in Table 4, was formed on the surface of the base metals under the same conditions except that for the cathode electrode (vapor source) a predetermined one type from Ti—Al alloys having various component compositions was mounted. By so doing, gear cutting tools corresponding to Table 4 "Conventional coated gear cutting tools 1 to 12" were respectively manufactured.

For the hard coating layers respectively constituting the abovementioned coated gear cutting tools 1 to 13 of the present invention and the conventional coated gear cuttings tools 1 to 12, the composition of the thickness direction central portion for each of the constituent layers was measured using the Auger spectroscopic apparatus. Furthermore, the layer thicknesses thereof were measured using a scanning electron microscope. In all of the cases, the objective composition and the objective layer thickness showed substantially the same composition and layer thickness.

Next, for hobs of the abovementioned present invention coated gear cutting tools 1 to 13 and the conventional coated gear cutting tools 1 to 12, under high-speed cutting conditions of;

cutting speed (rotation speed): 200 m/min (1062 rpm), and feed: 2.0 mm/rev, gear cutting was performed for gears having dimensions of; outside diameter 100 mm, length 25 mm, and number of teeth 48, and a material comprising a low-alloy steel of JIS SCr 420.

Furthermore, for pinion cutters, under high-speed cutting conditions of;

strokes per minute: 750 stroke/min circumferential feed: 4 mm/stroke and radial feed: 0.01 mm/stroke, gear cutting was performed for gears having dimensions of; outside diameter 66 mm, length 25 mm, number of teeth 31, and a material comprising low-alloy steel of JIS SCr 420.

Next, in each of the gear cutting processes, the number of gears cut until the maximum relief face wear of the cutting edge reached 0.2 mm was measured (useful life). These measurement results are respectively shown in Table 3 and Table 4. The ✖ mark in the column for the number of gears processed in Table 3 and Table 4 shows the results for a wet process (using cutting oil), while the non marked results show the results for a dry process (air blow).

From the results shown in Table 3 and Table 4, in the present invention coated gear cutting tools 1 to 13 where the hard coating layer comprises alternate multi-layers of the first thin layer and the second thin layer, even if the gear cutting process for low-alloy steel is performed at high-speed accompanied with high heat generation, due to the considerable improvement in the chip lubrication by the second thin layer, the affinity of the hard coating layer to chips with high temperature heating can be considerably reduced. As a result, the adhering of chips to the hard coating layer is prevented and the surface lubrication of the cutting edge is maintained. Consequently, the situation of the occurrence of chipping of the cutting edge attributable to the adhering of the chips to the cutting edge ceases to exist, and excellent wear resistance is demonstrated.

On the other hand, in the conventional coated gear cutting tools 1 to 12 where the hard coating layer substantially comprises a single layer of the same composition as the first thin layer, the chips are susceptible to adhering to the hard coating layer, and with this as the cause, the hard coated layer is partially pealed off. As a result, chipping occurs at the cutting edge, and the useful life is reached in a comparatively short time.

As described above, the coated gear cutting tool of the present invention demonstrates excellent surface lubrication with respect to chips, and shows generality in cutting performance, not only in the case of gear cutting of gears comprising carbon steel or cast iron or the like under normal conditions, but also in this case of high-speed gear cutting of gears comprising a low-alloy steel or mild steel or the like particularly with high viscosity, and which are susceptible to chips adhering to the cutting edge surface. Consequently, the coated gear cutting tool of the present invention contributes to speeding up of the gear cutting process, savings in labor and energy, and a reduction in costs.

The scope of the present invention is not limited to the above mentioned disclosed contents, and various modifications within a scope which does not depart from the gist of the present invention are also included in the present invention.

TABLE 2

| CLASSI-FICATION | | OBJECTIVE COMPOSITION (ATOMIC RATIO) | | | | | OBJECTIVE FILM THICK-NESS ($\mu$m) |
|---|---|---|---|---|---|---|---|
| | | Ti | Al | Ta | C | N | |
| FIRST THIN LAYER | A | 0.70 | 0.30 | — | — | 1.00 | 0.18 |
| | B | 0.55 | 0.45 | — | — | 1.00 | 0.005 |
| | C | 0.50 | 0.05 | — | — | 1.00 | 0.007 |
| | D | 0.45 | 0.55 | — | — | 1.00 | 0.15 |
| | E | 0.40 | 0.60 | — | — | 1.00 | 0.03 |
| | F | 0.35 | 0.65 | — | — | 1.00 | 0.01 |
| | G | 0.30 | 0.70 | — | — | 1.00 | 0.075 |
| | H | 0.60 | 0.40 | — | 0.40 | 0.60 | 0.12 |
| | I | 0.45 | 0.55 | — | 0.20 | 0.80 | 0.01 |
| | J | 0.35 | 0.65 | — | 0.01 | 99.9 | 0.08 |
| SECOND THIN LAYER | a | 0.35 | 0.30 | 0.35 | — | 1.00 | 0.07 |
| | b | 0.25 | 0.45 | 0.30 | — | 1.00 | 0.01 |
| | c | 0.25 | 0.50 | 0.25 | — | 1.00 | 0.18 |
| | d | 0.25 | 0.55 | 0.20 | — | 1.00 | 0.075 |
| | e | 0.25 | 0.60 | 0.15 | — | 1.00 | 0.005 |
| | f | 0.25 | 0.65 | 0.10 | — | 1.00 | 0.02 |
| | g | 0.29 | 0.70 | 0.01 | — | 1.00 | 0.20 |
| | h | 0.30 | 0.40 | 0.30 | 0.20 | 0.80 | 0.008 |
| | i | 0.30 | 0.55 | 0.15 | 0.10 | 0.90 | 0.015 |
| | j | 0.30 | 0.65 | 0.05 | 0.05 | 0.95 | 0.12 |

TABLE 1

| CLASSIFICATION | | MATERIAL | POST QUENCHING RESIDUAL AUSTENITE PROPORTION (wt %) | SUB-ZERO TREATMENT CONDITIONS | | | POST SUB-ZERO TREATMENT RESIDUAL AUSTENITE (wt %) | POST TEMPERING RESIDUAL AUSTENITE PROPORTION (wt %) | NO. OF GEARS CUT |
|---|---|---|---|---|---|---|---|---|---|
| | | | | COOLING RATE (° C./min) | COOLING TEMP. (° C.) | TEMP. RAISING RATE (° C./min) | | | |
| PRESENT INVENTION METHOD | 1 | SKH55 | 20.4 | 1 | −150 | 1 | 3.1 | 0.4 | 50 |
| | 2 | SKH55 | 20.4 | 2 | −180 | 2 | 2.2 | 0.3 | 55 |
| | 3 | SKH55 | 20.4 | 3 | −200 | 3 | 1.1 | 0.2 | 60 |
| | 4 | SKH56 | 25.6 | 1 | −150 | 1 | 3.9 | 0.4 | 55 |
| | 5 | SKH56 | 25.6 | 2 | −180 | 2 | 3.1 | 0.3 | 60 |
| | 6 | SKH56 | 25.6 | 3 | −200 | 3 | 2.1 | 0.2 | 70 |
| | 7 | SKH57 | 28.7 | 1 | −150 | 1 | 4.5 | 0.4 | 55 |
| | 8 | SKH57 | 28.7 | 2 | −180 | 2 | 3.6 | 0.3 | 65 |
| | 9 | 5KH57 | 28.7 | 3 | −200 | 3 | 2.5 | 0.2 | 70 |
| CONVENTIONAL METHOD | 1 | SKH55 | 20.4 | — | — | — | — | 1.5 | USEFUL LIFE AT 25 |
| | 2 | SKH56 | 25.6 | — | — | — | — | 2.3 | USEFUL LIFE AT 25 |
| | 3 | SKH57 | 28.7 | — | — | — | — | 4.2 | USEFUL LIFE AT 25 |

(USEFUL LIFE IN THE TABLE IS DUE TO CHIPPING AT THE CUTTING EDGE RIDGE LINE)

TABLE 3

| CLASSIFICATION | BASE METAL | HARD COATING LAYER | NO. OF GEARS CUT | USEFUL LIFE CAUSE |
|---|---|---|---|---|
| PRESENT INVENTION COATED GEAR CUTTING TOOLS | | | | |
| 1 | HOB | 30 ALTERNATE LAMINATIONS OF FIRST THIN LAYER A AND SECOND THIN LAYER j | 178✕ | NORMAL WEAR |
| 2 | PINION CUTTER | 200 ALTERNATE LAMINATIONS OF FIRST THIN LAYER B AND SECOND THIN LAYER i | 195 | NORMAL WEAR |
| 3 | HOB | 400 ALTERNATE LAMINATIONS OF FIRST THIN LAYER C AND SECOND THIN LAYER h | 252 | NORMAL WEAR |
| 4 | PINION CUTTER | 80 ALTERNATE LAMINATIONS OF FIRST THIN LAYER D AND SECOND THIN LAYER g | 183✕ | NORMAL WEAR |
| 5 | HOB | 280 ALTERNATE LAMINATIONS OF FIRST THIN LAYER E AND SECOND THIN LAYER f | 275 | NORMAL WEAR |
| 6 | PINION CUTTER | 400 ALTERNATE LAMINATIONS OF FIRST THIN LAYER F AND SECOND THIN LAYER e | 198 | NORMAL WEAR |
| 7 | HOB | 100 ALTERNATE LAMINATIONS OF FIRST THIN LAYER G AND SECOND THIN LAYER d | 197✕ | NORMAL WEAR |
| 8 | PINION CUTTER | 100 ALTERNATE LAMINATIONS OF FIRST THIN LAYER H AND SECOND THIN LAYER c | 172✕ | NORMAL WEAR |
| 9 | HOB | 100 ALTERNATE LAMINATIONS OF FIRST THIN LAYER I AND SECOND THIN LAYER b | 269✕ | NORMAL WEAR |
| 10 | HOB | 200 ALTERNATE LAMINATIONS OF FIRST THIN LAYER J AND SECOND THIN LAYER a | 191 | NORMAL WEAR |
| 11 | PINION CUTTER | 80 ALTERNATE LAMINATIONS OF FIRST THIN LAYER I AND SECOND THIN LAYER i | 263 | NORMAL WEAR |
| 12 | PINION CUTTER | 30 ALTERNATE LAMINATIONS OF FIRST THIN LAYER F AND SECOND THIN LAYER c (BASE METAL SIDE) + 40 ALTERNATE LAMINATIONS OF FIRST THIN LAYER B AND SECOND THIN LAYER g (SURFACE SIDE) | 178✕ | NORMAL WEAR |
| 13 | HOB | 100 ALTERNATE LAMINATIONS OF FIRST THIN LAYER G AND SECOND THIN LAYER e (BASE METAL SIDE) + 20 ALTERNATE LAMINATIONS OF FIRST THIN LAYER A AND SECOND THIN LAYER h (SURFACE SIDE) | 187 | NORMAL WEAR |

TABLE 4

| CLASSIFICATION | | BASE METAL | HARD COATING LAYER FIRST LAYER | | | | | HARD COATING LAYER SECOND LAYER | | | | | NO. OF GEARS CUT | USEFUL LIFE CAUSE |
|---|---|---|---|---|---|---|---|---|---|---|---|---|---|---|
| | | | OBJECTIVE COMPOSITION (ATOMIC RATIO) | | | | OBJECTIVE THICKNESS ($\mu$m) | OBJECTIVE COMPOSITION (ATOMIC RATIO) | | | | OBJECTIVE THICKNESS ($\mu$m) | | |
| | | | Ti | Al | C | N | | Ti | Al | C | N | | | |
| CONVENTIONAL COATED GEAR CUTTING TOOL | 1 | HOB | 0.70 | 0.30 | — | 1.00 | 4.5 | — | — | — | — | — | 62✕ | CHIPPING |
| | 2 | PINION CUTTER | 0.55 | 0.45 | — | 1.00 | 2.0 | — | — | — | — | — | 38 | CHIPPING |
| | 3 | HOB | 0.50 | 0.50 | — | 1.00 | 3.0 | — | — | — | — | — | 72 | CHIPPING |
| | 4 | PINION CUTTER | 0.45 | 0.55 | — | 1.00 | 14.5 | — | — | — | — | — | 91✕ | CHIPPING |
| | 5 | HOB | 0.40 | 0.60 | — | 1.00 | 7.0 | — | — | — | — | — | 84 | CHIPPING |
| | 6 | PINION CUTTER | 0.35 | 0.65 | — | 1.00 | 3.0 | — | — | — | — | — | 42 | CHIPPING |
| | 7 | HOB | 0.30 | 0.70 | — | 1.00 | 7.5 | — | — | — | — | — | 65✕ | CHIPPING |
| | 8 | PINION CUTTER | 0.60 | 0.40 | 0.20 | 0.80 | 15.0 | | | | | | | |
| | 9 | HOB | 0.45 | 0.55 | 0.10 | 0.90 | 10.0 | | | | | | | |
| | 10 | HOB | 0.35 | 0.65 | 0.01 | 99.9 | 15.0 | | | | | | | |
| | 11 | PINION CUTTER | 0.70 | 0.30 | — | 1.00 | 4.0 | | | | | | | |
| | 12 | PINION CUTTER | 0.30 | 0.70 | — | 1.00 | 2.85 | | | | | | | |

TABLE 4-continued

| | | | | | | | |
|---|---|---|---|---|---|---|---|
| 8 | — | — | — | — | — | 73※ | CHIPPING |
| 9 | — | — | — | — | — | 84※ | CHIPPING |
| 10 | — | — | — | — | — | 78 | CHIPPING |
| 11 | 0.30 | 0.70 | — | 1.00 | 0.5 | 94 | CHIPPING |
| 12 | 0.45 | 0.55 | 0.10 | 0.90 | 4.0 | 72※ | CHIPPING |

(IN THE TABLE, 'CHIPPING' IN ALL CASES INDICATES WHERE USEFUL LIFE REACHED DUE TO CHIPPING AT THE CUTTING EDGE)

What is claimed is:

1. A high-speed tool steel gear cutting tool comprising a hard coating which is physical vapor deposited at an overall average thickness of 2 to 15 μm, is formed on a surface of a base metal of a high-speed tool steel, by alternatingly laminating a plurality of first thin layers and a plurality of second thin layers with respective average thicknesses of 0.005 to 0.2 μm, each of said first thin layers comprising either or both of a (Ti, Al) N layer and a (Ti, Al) CN layer for which in the case where these are represented by composition formula: $[Ti_{1-x}Al_x]N$ and composition formula: $[Ti_{1-x}Al_x]C_{1-m}N_m$ the atomic ratio based on measurements using an Auger spectroscopy apparatus, of a thickness direction central portion satisfies X: 0.30 to 0.70, m: 0.6 to 0.99, and each of said second thin layers comprising either or both of a (Ti, Al, Ta) N layer and a (Ti, Al, Ta) CN layer for which in the case where these are represented by composition formula:

composition formula: $[Ti_{1-(X+Y)}Al_X Ta_Y]N$ and composition formula: $[Ti_{1-(X+Y)}Al_X Ta_Y]C_{1-m}N_m$, the atomic ratio based on measurements using an Auger spectroscopy apparatus, of a thickness direction central portion satisfies X: 0.30 to 0.70, Y: 0.01 to 0.35 and m: 0.6 to 0.99.

2. A high-speed tool steel gear cutting tool according to claim 1, wherein said base metal having a martensite matrix which contains residual austenite dispersingly distributed throughout the martensite matrix and the residual austenite is less than 0.5% in proportion with respect to martensite.

* * * * *